United States Patent [19]
Reisinger et al.

[11] Patent Number: 5,994,746
[45] Date of Patent: Nov. 30, 1999

[54] MEMORY CELL CONFIGURATION AND METHOD FOR ITS FABRICATION

[75] Inventors: Hans Reisinger, Grünwald; Reinhard Stengl, Stadtbergen; Franz Hofmann, München; Wolfgang Krautschneider, Hohenthann; Josef Willer, Riemerling, all of Germany

[73] Assignee: Siemens Aktiengesellschaft, Munich, Germany

[21] Appl. No.: 09/232,083

[22] Filed: Jan. 15, 1999

[30] Foreign Application Priority Data

Jan. 15, 1998 [DE] Germany ............................ 198 01 308

[51] Int. Cl.$^6$ .................................................. H01L 27/112
[52] U.S. Cl. ............................................. 257/390; 257/329
[58] Field of Search ...................... 257/390, 391, 257/327–334

[56] References Cited

U.S. PATENT DOCUMENTS

| | | |
|---|---|---|
| 4,992,838 | 2/1991 | Mori . |
| 5,233,210 | 8/1993 | Kodama ................................ 257/390 |
| 5,383,149 | 1/1995 | Hong . |
| 5,409,852 | 4/1995 | Faure et al. . |
| 5,426,066 | 6/1995 | Fu et al. . |
| 5,455,435 | 10/1995 | Fu et al. . |
| 5,510,287 | 4/1996 | Chen et al. . |
| 5,821,591 | 10/1998 | Krautschneider et al. ............. 257/390 |
| 5,825,069 | 10/1998 | Wen et al. ............................ 257/390 |
| 5,920,099 | 7/1999 | Krautschneider et al. ............. 257/390 |

FOREIGN PATENT DOCUMENTS

| | | |
|---|---|---|
| 0 164 095 A2 | 12/1985 | European Pat. Off. . |
| 0 783 181 A1 | 7/1997 | European Pat. Off. . |
| 44 17 150 A1 | 11/1995 | Germany . |
| 19510042A1 | 9/1996 | Germany . |

OTHER PUBLICATIONS

Japanese Patent Application No. 5-145042 (Hyodo), dated Jun. 11, 1993.

*Primary Examiner*—David B. Hardy
*Attorney, Agent, or Firm*—Herbert L. Lerner; Laurence A. Greenberg

[57] ABSTRACT

The memory cell has transistors that are arranged three-dimensionally. Vertical MOS transistors are arranged on the sidewalls of semiconductor webs, and a plurality of transistors are arranged one above the other on each sidewall. The transistors that are arranged one above the other on a sidewall are connected in series.

13 Claims, 3 Drawing Sheets

MEMORY CELL CONFIGURATION AND METHOD FOR ITS FABRICATION

BACKGROUND OF THE INVENTION

Field of the Invention

The invention lies in the semiconductor technology field and pertains, in particular, to memory cells. Memory cells are used in broad technological fields. The memory cells include not only read-only memories, referred to as ROMs, but also programmable memories, referred to as PROMs (programmable ROMs).

Memory cell configurations on semiconductor substrates are distinguished by the fact that they permit random access to the information stored in them. They contain a multiplicity of transistors. In the course of the reading operation, it is ascertained whether or not a current flows through a given transistor. A current flow through the transistor or blocking of the transistor are in this case assigned the logic states 1 or 0. The storage of the information is usually effected by using MOS transistors whose channel regions have a doping that corresponds to the desired blocking property.

German published patent application DE 195 10 042 A1 discloses a memory cell configuration with MOS transistors arranged in rows. In each row, the MOS transistors are connected in series. In order to increase the storage density, adjacent rows are in each case arranged alternately on the bottom of strip-type longitudinal trenches and between adjacent strip-type longitudinal trenches on the surface of the substrate. Source/drain regions which are connected to one another are constructed as a coherent doped region. That memory cell configuration can be read out by driving it row-by-row.

That memory cell configuration is distinguished by the fact that the area requirement which is necessary for the memory cells has been reduced from 4 $F^2$ to 2 $F^2$, where F is the minimum structure width of the photolithographic process used for the fabrication. However, it is disadvantageous that a further increase in the number of memory cells per unit area is not possible in this case.

U.S. Pat. No. 5,409,852 describes the arrangement of MOS transistors one above the other in order to increase the packing density. In order to make contact with transistors of this type, use is made of buried, doped layers which are correspondingly structured and are connected to metallic contacts.

SUMMARY OF THE INVENTION

It is accordingly an object of the invention to provide a memory cell configuration and a method for producing the cell, which overcomes the above-mentioned disadvantages of the heretofore-known devices and methods of this general type and which results in a memory cell configuration in which the largest possible number of memory cells can be arranged in the smallest possible space.

With the foregoing and other objects in view there is provided, in accordance with the invention, a memory cell configuration, comprising:

a semiconductor substrate having a main surface;

a plurality of webs disposed on and projecting above the main surface of the semiconductor substrate;

each of the webs being formed of a stack of doped layers with mutually adjacent layers having respectively opposite conductivity type doping, the stack having sidewalls;

three adjacent doped layers forming two source/drain regions and a channel region of a transistor;

a gate dielectric disposed on at least one sidewall of the stacks;

word lines running transversely to the webs and adjoining the gate dielectric at the sidewalls of the stacks;

bit lines formed by the doped layers acting as the source/drain regions;

the stack containing a number of doped layers sufficient to form at least two transistors disposed one above the other and connected in series via a common doped layer defining a common source/drain region.

In other words, webs are arranged on the main surface of the semiconductor substrate. The webs each have a stack of doped layers. Mutually adjacent layers in each case are doped by the opposite conductivity type. Three adjacent doped layers in each case form two source/drain regions and a channel region of a field effect-controlled transistor. At least one sidewall of the stack is provided with a gate dielectric in each case. Word lines run transversely with respect to the webs and in each case adjoin the gate dielectric in the region of the sidewalls of the stacks. The doped layers acting as source/drain region simultaneously act as bit lines of the memory cell configuration. Enough doped layers are provided in the memory that at least two transistors are realized by the doped layers, which transistors are arranged one above the other and are connected up in series via a common doped layer, which acts as a common source/drain region.

In this memory cell configuration, the crossover point between one of the word lines and a doped layer, which acts as channel region, and also the two adjacent doped layers, which act as source/drain regions, in each case defines a transistor. Adjacent transistors which are connected up in series have a common source/drain region. The current flow in the transistors runs parallel to the sidewall of the stack.

In accordance with an added feature of the invention, the stack contains a number of doped layers sufficient to form between 4 and 32 transistors disposed one above the other and connected in series in each case via a common doped layer defining a common source/drain region. A high packing density is achieved as a result.

The webs have a strip-type cross section parallel to the main surface of the substrate. Adjacent webs are preferably arranged parallel to one another.

In accordance with an additional feature of the invention, the word lines are a plurality of mutually spaced-apart word lines each running transversely to the webs. In this way, a multiplicity of transistors are arranged next to one another along the length of the webs, which transistors can be driven via the respective word line.

The invention therefore envisages providing a memory cell configuration in which all three spatial dimensions are utilized for storing and/or passing on information. This is done by arranging a number N of transistors one above the other. In this case, the area requirement which is necessary for each memory cell is reduced from 4 $F^2$ to 4 $F^2/N$. This reduction in area is achieved by three-dimensional integration with stacking of N transistors one above the other.

The purpose of the invention, that of reducing the area, is effected by the stacking of transistors that has been explained. The other measures make it easier to fabricate the memory cell configuration and lead to the highest possible switching speed. An individual feature of the features explained is not, therefore, a matter of unique importance. The terms used here are employed in their broadest meaning.

In particular, the term of gate dielectric is in no way meant to be restrictive. It encompasses both a conventional dielectric and a dielectric having an increased charge carrier capture cross section, which contains $Si_3N_4$, $Ta_2O_5$, $Al_2O_3$ or $TiO_2$, for example. A more complex gate dielectric may also be involved in this case, however, for example having a structure with the sequence ONO (Oxide/Nitride/Oxide), which has a first $SiO_2$ layer, an $Si_3N_4$ layer and a second $SiO_2$ layer. This makes it possible to configure both a memory cell configuration which is programmable during the fabrication process and a memory cell configuration which is reprogrammable during its operation.

In accordance with another feature of the invention, the doped layers defining the channel region have a dopant concentration corresponding to one of two different dopant concentration values in a crossover region with one of the word lines.

This means that logic values 0 and 1 are stored by the transistors having different dopant concentrations in the channel region. Transistors in which the one logic value is stored have a first dopant concentration value in the channel region and transistors in which a second logic value is stored have a second dopant concentration value, which differs from the first. The different dopant concentrations in the channel region effect different threshold voltages of the transistor and thus allow a distinction to be made between the different logic values.

In accordance with a further feature of the invention, the two different dopant concentration values differ from one another by a factor of between 2 and 10. This measure assures reliable read-out of the stored information.

A first dopant concentration may have a value between $0.5 \times 10^{18}$ $cm^{-3}$ and $2 \times 10^{18}$ $cm^{-3}$, and a second dopant concentration may have a value between $0.5 \times 10^{19}$ $cm^{-3}$ and $2 \times 10^{19}$ $cm^{-3}$.

In accordance with again an added feature of the invention, the gate dielectric contains a material with charge carrier traps. The gate dielectric may be formed, in particular, from a multilayer system in which one of the layers has a higher charge carrier capture cross section than the adjacent layers. Charge carriers captured in the gate dielectric influence the threshold voltage of the transistor. In this refinement of the memory cell configuration, logic information is stored by targeted introduction of the charge carriers.

In accordance with again another feature of the invention, each of the webs includes two layer stacks and an insulation region separating the two layer stacks. In this case, the insulation region may likewise be constructed in strip form and define two strip-type layer stacks. In this refinement, transistors are realized on opposite sidewalls of the webs. The packing density is further increased in this way.

In accordance with again a further feature of the invention, a doped region is formed in the semiconductor substrate adjoining the main surface, and the doped region connects two doped layer stacks of mutually adjacent webs in series.

In accordance with yet an added feature of the invention, a common conductive layer is disposed above the doped layer stacks and the insulation region and connects the two doped layer stacks in a respective web in series.

It lies within the scope of the invention for each two layer stacks arranged in adjacent webs to be connected up in series via a doped region which is arranged in the semiconductor substrate and adjoins the main surface. Furthermore, layer stacks contained in a web can be connected up in series by means of a common conductive layer arranged above the layer stacks and the insulation region. The number of electrical planes is increased by the adjacent layer stacks connected up in series.

The memory cell configuration according to the invention is not restricted to a specific topology of its component parts. The spatial arrangement explained here is particularly advantageous, however. While the active regions of the transistors lie one on top of the other, the other circuit elements can be arranged in any desired manner. The other component parts of the transistors can also be arranged in a different way. Particularly good utilization of space can be achieved, however, by arranging the gate dielectric perpendicularly to a main surface of the semiconductor substrate. Such an arrangement can expediently be realized by the gate dielectric being situated on a sidewall of the web.

Contact can be made with the bit lines, which are arranged one above the other in each of the stacks, in different ways. In particular, the layer stack may be structured in each case such that each of the bit lines is uncovered at the edge of the cell array. In this case, the layer stack has a staircase cross section at the edge of the cell array, the bit lines arranged further down in the layer stack in each case projecting laterally beyond those arranged above them.

In accordance with yet an alternative feature of the invention, a decoder is provided for driving the bit lines. The decoder includes MOS transistors connected between two bit lines respectively. In a preferred embodiment, the decoder includes series-connected MOS transistors arranged one above the other in the webs. For this purpose, further selection lines are provided which cross the layer stack. As a result, a transistor of the decoder is realized in each case at the crossover point between one of the selection lines and the layer stack. The structure of the transistors of the decoder is thus analogous to the structure of the transistors in the memory cell array. Each of the decoder transistors is connected between two adjacent bit lines. Arranged one above the other and connected up in series with one another are as many decoder transistors as there are transistors arranged one above the other in the memory cell array. The different threshold voltages of the decoder transistors are realized by different dopant concentrations in the channel region of the decoder transistors. If necessary, a plurality of decoders may be realized in one web, transistors of the memory cell configuration being arranged in each case between said decoders. An excessively large voltage drop across the bit lines is avoided in this way.

With the above and other objects in view there is also provided, in accordance with the invention, a method of fabricating a memory cell configuration. The method comprises the steps of:

forming doped layers on a main surface of a semiconductor substrate, and doping mutually adjacent doped layers with an opposite conductivity type;

forming webs with sidewalls by structuring the doped layers; placing a gate dielectric on at least one sidewall of the webs; and forming word lines extending transversely with respect to the webs and adjoining the gate dielectric at the sidewall.

In accordance with a concomitant feature of the invention, the doped layers are applied by epitaxy. The epitaxy is preferably carried out such that it is doped in situ. If the different information items are intended to be realized in the form of different doping in the channel region, then the dopant concentration for the MOS transistors is set by implantation after the growth of the respective doped layer containing the channel region.

Other features which are considered as characteristic for the invention are set forth in the appended claims.

Although the invention is illustrated and described herein as embodied in a memory cell configuration and method for its fabrication, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
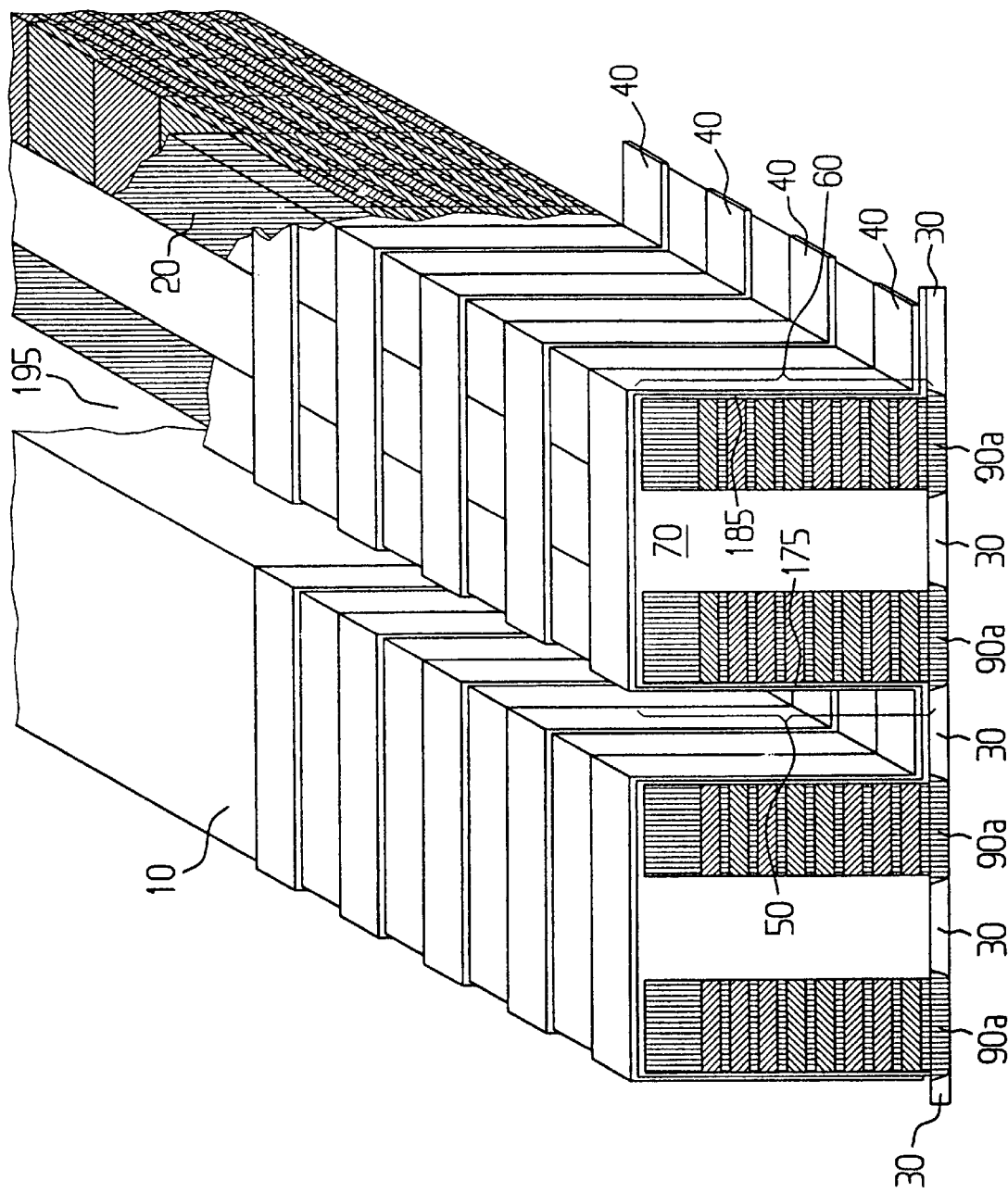
FIG. 1 is a partly broken-away, top perspective view of a detail of a memory cell configuration.

Referring now to the figures of the drawing in detail and first, particularly, to FIG. 1 thereof, there are seen two webs 10, 20 each forming a memory cell row of the memory cell configuration. The webs 10 and 20 are situated on a surface of a semiconductor substrate 30, which is preferably composed of monocrystalline silicon. The semiconductor substrate 30 is p-doped with a dopant concentration of about $10^{17}$ cm$^{-3}$ at least in the region of the cell array. Several n-doped regions 90a are formed in the semiconductor substrate 30. The n-doped regions 90a have a depth of about 200 nm and a dopant concentration of $4 \times 10^{19}$ cm$^{-3}$. Two n-doped regions 90a are arranged underneath each web 10, 20.

Word lines 40 are arranged on the webs 10 and 20. The word lines 40 are composed of a conductive material, for example of a semiconductor material, which is highly doped, for example of polycrystalline silicon. Word lines 40 composed of silicon can additionally be silicided. However, it is likewise possible for the word lines 40 to be composed of a metal. The word lines 40 extend essentially parallel to the surface of the semiconductor substrate 30 and transversely to the longitudinal extent of the webs 10 and 20.

Figure 2:
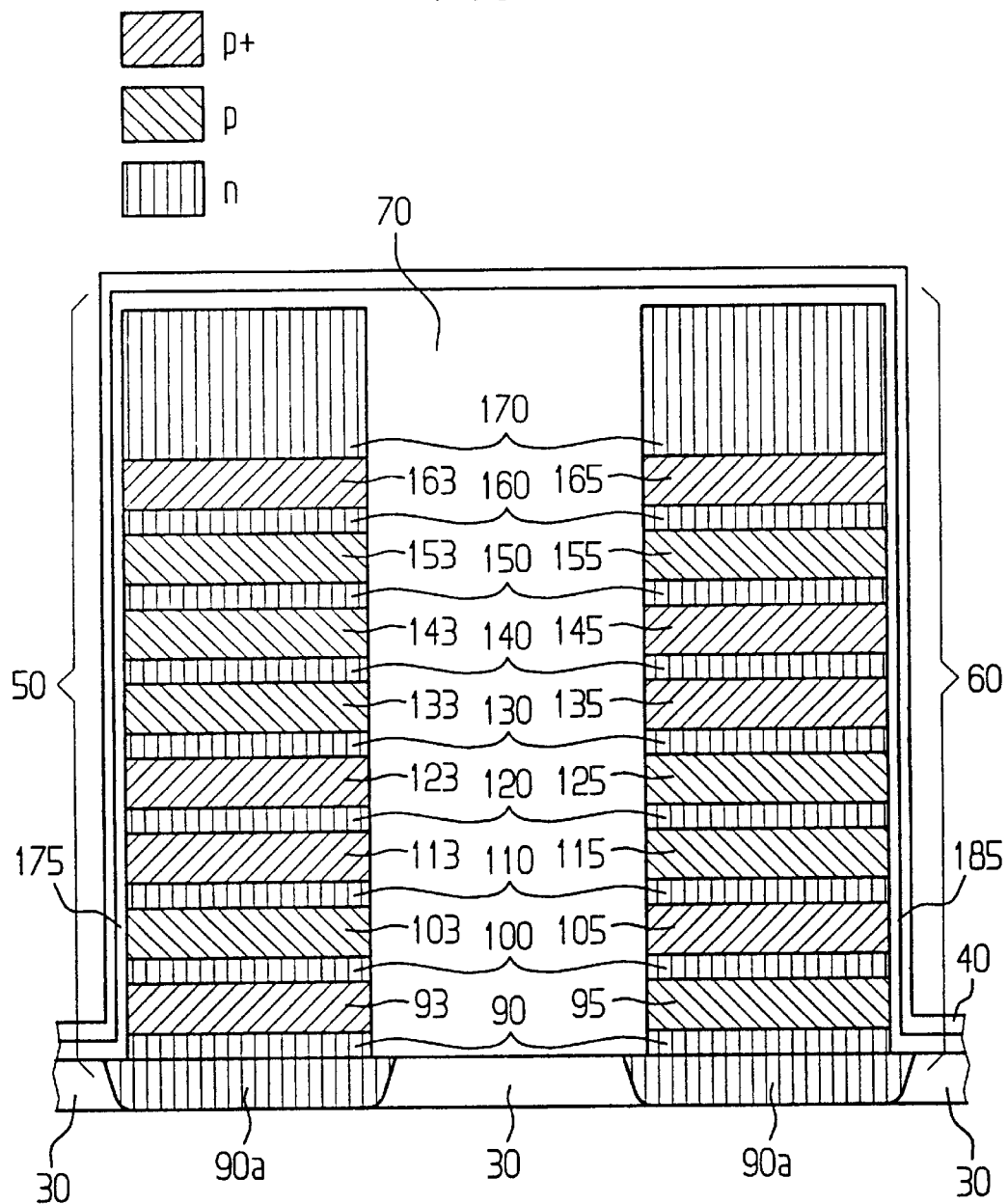
FIG. 2 is an elevational view of an enlarged detail of the memory cell configuration of FIG. 1.

The exact structure of the web 20 is illustrated in FIG. 2. The webs 10 and 20 each contain layer stacks 50 and 60, which are separated from one another by an insulation region 70. The insulation region 70 has $SiO_2$. Each of the layer stacks 50 and 60 contains a plurality of layers arranged one above the other. In this case, one layer stack 50 contains layers 90, 93, 100, 103, 110, 113, 120, 123, 130, 133, 140, 143, 150, 153, 160, 163 and 170. The other layer stack 60 contains the layers 90, 95, 100, 105, 110, 115, 120, 125, 130, 135, 140, 145, 150, 155, 160, 165 and 170. The layers 90, 100, 110, 120, 130, 140, 150, 160 and 170 have the highest possible n-type doping. Since the n-doped layers 90, 100, 110, 120, 130, 140, 150, 160 and 170 serve as bit lines in the memory cell, they have the highest possible concentration of the dopant, for example phosphorus. In order to minimize the bulk resistance, the concentration of the dopant in the bit lines is preferably more than $5 \times 10^{19}$ cm$^{-3}$. The n-doped layers 90, 100, 110, 120, 130, 140, 150 and 160 have a thickness of 50 nm in each case, and the n-doped layer 170 has a thickness of 400 nm.

The first layer stack 50 has p-doped layers 93, 103, 113, 123, 133, 143, 153 and 163, which are situated between the n-doped layers 90, 100, 110, 120, 130, 140, 150, 160 and 170 and have a thickness of 100 nm in each case. The layers 93, 113, 123 and 163 are in this case heavily doped. The other p-doped layers 103, 133, 143 and 153 are, in contrast, lightly doped. The layer stack 60 has layers 95, 105, 115, 125, 135, 145, 155 and 165, which are likewise doped with a p-type dopant and have a thickness of 100 nm in each case. The layers 105, 135, 145 and 165 are heavily doped in this case. The further p-doped layers 95, 115, 125 and 155 are, in contrast, lightly doped. The light doping is preferably of the order of magnitude of $1 \times 10^{18}$ cm$^{-3}$ while the heavier doping is preferably of the order of magnitude of $1 \times 10^{19}$ cm$^{-3}$. The light doping and the heavier doping have different threshold voltages and thus make it possible to distinguish between a stored logic state 0 or 1. The doping of the bit lines doped with an n-type dopant is preferably at least $4 \times 10^{19}$ cm$^{-3}$, a doping of $1 \times 10^{20}$ cm$^{-3}$ or more being preferred. Given a dopant concentration of $4 \times 10^{19}$ cm$^{-3}$, the bit lines have a specific resistance (resistivity) of approximately 2 mΩ cm.

Eight transistors lying one above the other are formed by the layers 90, 95, 100, 105, 110, 115, 120, 125, 130, 135, 140, 145, 150, 155, 160, 165, 170 of the layer stack 60 which are arranged one above the other. Likewise, the layers 90, 93, 100, 103, 110, 113, 120, 123, 130, 133, 140, 143, 150, 153, 160, 163, 170 of the layer stack 50 which are arranged one above the other form eight transistors lying one above the other. Insulation regions 175 and 185 containing $SiO_2$ are situated in the edge region of the webs 10, 20 laterally with respect to the layer stacks 50 and 60. The insulation regions 175 and 185 serve as gate dielectrics for the transistors formed by the layer stacks 50 and 60. The insulation regions 175 and 185 serving as gate dielectrics have a thickness of approximately 10 nm.

In order to obtain programmability of the memory cells, it is expedient for the gate dielectric to be composed of a material having an increased charge carrier capture cross section. This can be done, for example, by using suitable nitrides such as $Si_3N_4$ or oxides such as $Ta_2O_5$, $Al_2O_3$ or $TiO_2$.

The memory cell rows are configured in such a way that the effective resistance of the bit line between a selected memory transistor and the periphery results from the resistivity of the so-called thin bit lines 100 to 160, that of the so-called thick bit lines 90, 90a and 170 as well as their length. The layer 90 and the adjoining n-doped region 90a in this case jointly act as a thick bit line. Given a length of the bit lines of 2000 F, a length and thickness of the bit lines which in each case amounts to the minimum structure width F, and also a resistivity of 1 mΩ cm (this corresponds to a doping of $1 \times 10^{20}$ cm$^{-3}$) and a minimum structure width F=0.5 μm, the resulting resistance of the thick bit lines is 40 kΩ. It is desirable for the resistance of the thin bit lines to be 20 kΩ at most. The capacitance between two bit lines having these dimensions is 0.6 pF over a length of 1000 cells. As a result of this, in the worst case, the maximum access time is of the order of magnitude of 2×(20+20) kΩ×0.6 pF≈50 ns.

The distance between the centers of adjacent word lines is 2 F, for example, where F is the minimum structure size which can be fabricated, and is between 0.1 μm and 0.5 μm, for example. The webs 10 and 20 have lateral sidewalls. The word lines 40 are continued across these lateral sidewalls. Crossover points between the bit lines 90, 100, 110, 120, 130, 140, 150, 160 and 170 and the word lines 40 are situated on the lateral sidewalls. The crossover region is defined as a memory cell.

An area requirement of 4 $F^2$/N is produced as a result of this. If N=8 bit lines are arranged one above the other, the area requirement for each memory cell is 0.5 F², that is to say, given F=0.5 μm:0.125 μm.

The region in which the word lines 40 cross the bit lines 90, 100, 110, 120, 130, 140, 150, 160 and 170 corresponds to the memory cell array of the memory cell configuration. Conventional selection switches are provided outside the memory cell array. The selection switches have bit selection lines. A plurality of bit lines lying one above the other can be combined to form a node by a non-illustrated metallization layer. The number of bit selection lines arranged between the node and further doped layers corresponds to the number of bit lines which are united in the node.

A particularly favorable connection of the bit lines is produced by integrating a decoder in the cell array. This integration is preferably effected three-dimensionally, in particular with the same structure as that of the webs 10 and 20. At least one 1-out-of-8 decoder is provided in order to read from the memory cell configuration. The decoder has six successive word lines A, $\overline{A}$, B, $\overline{B}$, C, $\overline{C}$ (see FIG. 3) which allow two bit lines (100 to 160) lying one above the other in each case to be conductively connected to the thick bit lines (90, 170), (for example 150 connected to 170 and 140 connected to 90). Consequently, one layer is selected from the stack of eight transistors lying one above the other. The MOS transistors have different threshold voltages. In each case one MOS transistor having a relatively high threshold voltage and one MOS transistor having a relatively low threshold voltage are arranged alternately one above the other in a first web of the 1-out-of-8 decoder. In each case two MOS transistors having a relatively high threshold voltage and two MOS transistors having a relatively low threshold voltage are arranged alternately one above the other in a second web of the 1 out-of 8 decoder. In each case four NOS transistors having a relatively high threshold voltage and four MOS transistors having a relatively low threshold voltage are arranged one above the other in a third web of the 1-out-of-8 decoder. Each two word lines are arranged along mutually opposite sidewalls of the first web, of the second web and of the third web, respectively. The MOS transistors adjoining opposite sidewalls of one and the same web in the same layer are complementary to one another in this case. Only the thick bit lines 90, 170 are routed out from the cell array. The thin bit lines 100, 110, 120, 130, 140, 150, 160 arranged in between are selected by corresponding driving of the decoder.

In a 1-out-of-N decoder, the grid spacing of the bit lines running from the cell array into the periphery is 2 F. In a 1-out-of-2 N decoder the grid spacing increases to 4 F. In a 1-out-of-4 N decoder, the grid spacing is as much as 8 F.

The memory cell configuration illustrated in FIG. 1 can be fabricated as follows:

A p-doped well having a dopant concentration of, for example, $1 \times 10^{17}$ cm$^{-3}$ is formed by implantation in a substrate 30 made of, for example, p-doped monocrystalline silicon having a basic dopant concentration of $2 \times 10^{15}$ cm$^{-3}$. The p-doped well preferably has a depth of approximately 1 μm.

The n-doped regions 90a are fabricated as diffusion region by the implantation of phosphorus atoms with a dose of approximately $5 \times 10^{15}$ at/cm$^{-2}$ and a low implantation energy of 100 keV, for example, using a photomask. The n-doped regions 90a can thus serve as source or drain in the finished memory cell. The following n-doped and lightly p-doped layers are fabricated by epitaxial growth and in-situ doping.

The n-doped layers 90, 100, 110, 120, 130, 140, 150, 160 and 170 and also the weakly p-doped layers 95, 103, 115, 125, 133, 143, 153 and 155 grow at temperatures of the order of magnitude of T=1000° C. and pressures of the order of magnitude of 100 torr (133 mbar). The n-doping is effected in a gas mixture of $H_2$, $SiH_4$ and $AsH_3$. The p-doping is effected in a gas mixture of $H_2$, $SiH_4$ and $B_2H_6$.

The more heavily p-doped layers are fabricated by effecting implantation after epitaxial deposition of the respective layer. A photomask is used for this implantation. The implantation is carried out for example using boron with a dose of approximately $3 \times 10^{12}$ cm$^2$ and an energy of the order of magnitude of 25 keV.

The bottommost n-doped layer 90 and the n-doped region 90a have a greater layer thickness than the further n-doped layers 100, 110, 120, 130, 140, 150 and 160 situated above them. The layer 90, 90a has a greater thickness because it is situated partially within the semiconductor substrate 30, which is preferably monocrystalline. It is expedient for the resistance of the layer 90 to be reduced by the adjoining n-doped region 90a particularly when the semiconductor substrate 30 is composed of monocrystalline silicon. The topmost n-doped layer 170 is constructed with a lower resistance than the layers 100, 110, 120, 130, 140, 150 and 160. This can be effected, for example, by forming the topmost n-doped layer 170 of a silicide or of a metal.

A trench structure is subsequently fabricated by etching a trench 195 inn between the webs 10 and 20. The width of the trenches and stacks is F and the depth of the trenches is of the order of magnitude of N×(100 nm+50 nm), where N preferably lies between 4 and 32.

After the trenches 195 have been etched, the word lines 40 are deposited. This is done, for example, as follows: first of all, in one of the known layer production processes, for example a CVD (Chemical Vapor Deposition) process, a layer made of a polycrystalline semiconductor material or made of a metal is conformally deposited. This layer is subsequently patterned by means of conventional photolithographic process steps in such a way that the individual word lines 40 are formed. The distance between the individual word lines 40 is chosen to be as small as possible. The lower limit of the spacing distance between two centers of the bit lines is determined by the photolithographic process used. The distance between the centers of two adjacent word lines 40 is thus F.

After the word lines 40 have been applied, the trench situated between the webs 10 and 20 can be filled with a suitable insulating material. It is expedient to apply an insulating material in such a way particularly when further planes containing electrical lines are intended to be applied above the webs 10 and 20.

In a variant of this exemplary embodiment, the stacks of transistors of a web arranged one above the other are connected up in series by connecting the associated bit lines 170 to one another. Furthermore, the stacks arranged in different webs can be connected up in series by connecting the associated n-doped regions to one another. This is preferably effected by the configuration as a common doped region or as a common layer. This enables the number of electrical planes to be increased.

Figure 3:
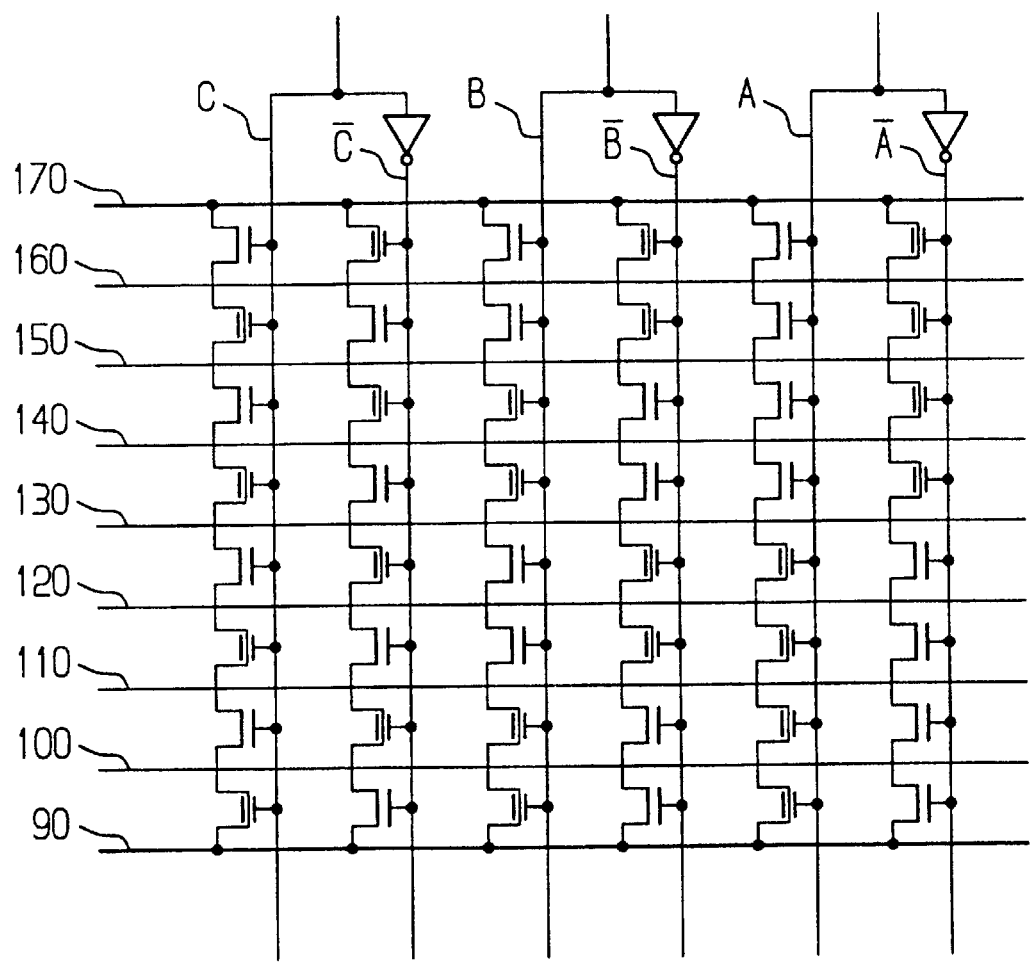
FIG. 3 is a circuit schematic of an arrangement for driving word lines and bit lines contained in the memory cell configuration.

Referring now to FIG. 3, the following circuit arrangement for driving the word and bit lines is particularly advantageous:

The circuit illustrated in FIG. 3 is a 1-out-of-8 decoder. The 1-out-of-8 decoder is constructed in the manner explained above. In FIG. 3, conventional circuit symbols are used for n-channel MOS transistors and for the p-channel MOS transistors which are complementary thereto. Decoders are switching networks having a plurality of data inputs which are controlled in such a way that the binary information items present in the inputs are present one after the other at a common output.

In the case of the 1-out-of-8 decoder which is illustrated in FIG. 3 and is constructed in the manner explained above, two arbitrary adjacent bit lines arranged in the web are selected. The transistor located between the two bit lines is read as a result of this. The two bit lines are electrically connected to the bit lines of the planes 90 and 170 by corresponding driving of the decoder. The bit lines 90 and 170 are thicker and thus have a lower resistance than the bit lines of the planes 100 to 160. The planes 90 and 170 are conducted to a non-illustrated electronic evaluation unit. The selection is effected for the entire cell array. The 1-out-of-N decoder comprises $LOG_2$ (N)*2 word lines, that is to say, for example, eight word lines with N=6, and ten word lines with N=32. The 1-out-of-N decoder is constructed like the memory modules of the cell array, that is to say has a higher level of integration than the rest of the periphery, which is preferably of planar design. It is essential that the information is fixed in the region of the selection circuit. In order to minimize the effective resistance of the bit lines, it is practical to repeat the decoder in the cell array relatively frequently, typically every 200 word lines, for example.

Such a decoder can be integrated in the cell array without interrupting the cell array.

It is possible to reduce the effective bit line resistance further by interconnecting bit lines.

Those of skill in the art will appreciate that the invention is not restricted to the exemplary embodiments illustrated. In particular, it is possible to interchange the conductivity types n and p.

Furthermore, it lies within the scope of the invention to provide a programmable memory cell configuration (PROM). This can be done in a particularly expedient manner by forming the gate dielectric from a material having traps for electric charge carriers. It is preferably replaced by an ONO dielectric (oxide/nitride/oxide), which contains a first $SiO_2$ layer, an $Si_3N_4$ layer, and a second $SiO_2$ layer.

The memory cell configuration is then programmed by filling the traps by injecting electrons. This increases the threshold voltage at which a conductive channel forms underneath the respective word line, which acts as a gate electrode. The respective value of the threshold voltage increase can be set by way of the time and magnitude of the applied voltage during the programming.

In the case of an ONO dielectric (oxide/nitride/oxide), it is possible to dispense with the implantation in the cell array, so that implantation is necessary only in the decoder. When an ONO dielectric is used, charge can be stored and the memory cell configuration can thus be programmed for example by Fowler-Nordheim tunneling of electrons or else by hot electron injection.

In order to write in the information by Fowler-Nordheim, the memory cell to be programmed is selected via the associated word line and the associated bit line. The bit line of the memory cell is placed at low potential, for example at zero volts. The associated word line, on the other hand, is placed at high potential, for example at 12 volts. The other bit lines are raised to a potential which is dimensioned such that it is distinctly less than the programming voltage. The other word lines are raised to a potential which is greater than the sum of the potential of the other bit lines and a threshold voltage.

The threshold voltage is that voltage which is necessary for a significant increase in the threshold voltage of the MOSFET to occur by Fowler-Nordheim tunneling within a finite time.

Since all other bit lines which cross the selected word line are at higher potential in the course of the programming, the other memory cells connected to the selected word line are not programmed. The memory cells are preferably connected up in a NAND configuration. They can, therefore, be connected in such a way that a drain current flows through the memory cells. That has the advantage that the entire programming operation proceeds using very little power.

The energy required to program a cell is approximately $E \approx 5 \times 10^{-12}$ charge carriers/$cm^2 \times e \times 10$ V'(0.5 $\mu$m$\times$0.1 $\mu$m)= $4 \times 10^{-15}$ J.

It is likewise possible for the programming to be carried out by hot electron injection. A decoder selects a plane in which all the cells whose word lines are at a high potential are written to. Word lines which are not at the high potential are not programmed in this case. For the purpose of programming, a saturation voltage must be applied to the MOS transistor to be programmed. For this purpose, the bit line associated with the memory cell is connected between a low potential, preferably the ground potential, and a high potential usually of approximately 6 volts. The word line assigned to the memory cell is put at a potential at which the MOS transistor is in saturation operation. The voltage applied to the word line is less than the applied saturation voltage and is usually approximately 4 volts. The other word lines are put at a higher potential, of the order of magnitude of 7 volts, for example. This voltage is chosen as a function of the thickness of the gate dielectric such that Fowler-Nordheim tunneling does not yet occur. All other bit lines are put at the same potential at both ends, for example half the saturation voltage.

In the course of programming, it is important that the layers which are not selected for the programming operation be at a low potential.

This prevents memory cells lying along the selected word line on other bit lines from being programmed and avoids a current flow. As a result of the saturation operation at high voltage, high-energy electrons, which are also referred to as hot electrons, arise in the channel operation of the MOS transistor of the selected memory cell. Some of these hot electrons are injected into the gate dielectric. The electrons are determined by traps in the gate dielectric and increase the threshold voltage of the MOS transistor. In this way, the threshold voltage of the respective MOS transistor is altered in a targeted manner depending on the information to be stored in the respective memory cell.

Fowler-Nordheim programming is preferable, owing to the shorter programming time and smaller programming power.

We claim:

1. A memory cell configuration, comprising:
a semiconductor substrate having a main surface;
a plurality of webs disposed on and projecting above said main surface of said semiconductor substrate;
each of said webs being formed of a stack of doped layers with mutually adjacent layers having respectively opposite conductivity type doping, said stack having sidewalls;
three adjacent doped layers forming two source/drain regions and a channel region of a transistor;
a gate dielectric disposed on at least one sidewall of said stacks;

word lines running transversely to said webs and adjoining said gate dielectric at said sidewalls of said stacks;

bit lines formed by said doped layers acting as said source/drain regions;

said stack containing a number of doped layers sufficient to form at least two transistors disposed one above the other and connected in series via a common doped layer defining a common source/drain region.

2. The memory cell configuration according to claim 1, wherein said stack contains a number of doped layers sufficient to form between 4 and 32 transistors disposed one above the other and connected in series in each case via a common doped layer defining a common source/drain region.

3. The memory cell configuration according to claim 1, wherein said word lines are a plurality of mutually spaced-apart word lines each running transversely to said webs.

4. The memory cell configuration according to claim 1, wherein said doped layers defining said channel region have a dopant concentration corresponding to one of two different dopant concentration values in a crossover region with one of said word lines.

5. The memory cell configuration according to claim 4, wherein the two different dopant concentration values differ from one another by a factor of between 2 and 10.

6. The memory cell configuration according to claim 4, wherein the two different dopant concentration values includes a first dopant concentration value between $0.5 \times 10^{18}$ $cm^{-3}$ and $2 \times 10^{18}$ $cm^{-3}$, and a second dopant concentration value between $0.5 \times 10^{19}$ $cm^{-3}$ and $2 \times 10^{19}$ $cm^{-3}$.

7. The memory cell configuration according to claim 1, wherein said gate dielectric contains a material defining charge carrier traps.

8. The memory cell configuration according to claim 1, wherein said gate dielectric contains a multilayer system.

9. The memory cell configuration according to claim 1, wherein each of said webs includes two layer stacks and an insulation region separating said two layer stacks.

10. The memory cell configuration according to claim 9, which further comprises a doped region formed in said semiconductor substrate adjoining said main surface, said doped region connecting two doped layer stacks of mutually adjacent webs in series.

11. The memory cell configuration according to claim 9, which further comprises a common conductive layer disposed above said doped layer stacks and said insulation region and connecting said two doped layer stacks in a respective web in series.

12. The memory cell configuration according to claim 1, which further comprises a decoder for driving said bit lines, said decoder including MOS transistors connected between two bit lines respectively.

13. The memory cell configuration according to claim 12, wherein said decoder includes series-connected MOS transistors arranged one above the other in said webs.

* * * * *